United States Patent
Bloom et al.

(10) Patent No.: US 9,490,261 B2
(45) Date of Patent: Nov. 8, 2016

(54) MINIMIZING DISTURBS IN DENSE NON VOLATILE MEMORY ARRAYS

(75) Inventors: Ilan Bloom, Haifa (IL); Amichai Givant, Rosh-Ha'ayin (IL); Boaz Eitan, Hofit (IL)

(73) Assignee: Cypress Semiconductor Ltd., Netanya (IL)

( * ) Notice: Subject to any disclaimer, the term of this patent is extended or adjusted under 35 U.S.C. 154(b) by 343 days.

(21) Appl. No.: 13/317,460

(22) Filed: Oct. 19, 2011

(65) Prior Publication Data

US 2012/0098052 A1    Apr. 26, 2012

Related U.S. Application Data (60) Provisional application No. 61/344,840, filed on Oct. 21, 2010.

(51) Int. Cl.
| | |
|---|---|
| *H01L 21/8238* | (2006.01) |
| *H01L 21/8234* | (2006.01) |
| *H01L 21/3205* | (2006.01) |
| *H01L 27/115* | (2006.01) |
| *H01L 29/66* | (2006.01) |
| *H01L 29/792* | (2006.01) |

(52) U.S. Cl.
CPC ... *H01L 27/11568* (2013.01); *H01L 29/66833* (2013.01); *H01L 29/792* (2013.01)

(58) Field of Classification Search
CPC .......... H01L 27/11563; H01L 27/112; H01L 27/10; H01L 27/115; H01L 27/11; H01L 27/11568; H01L 29/66833; H01L 29/66883
USPC ................................................. 257/324, 390
See application file for complete search history.

(56) References Cited

U.S. PATENT DOCUMENTS

| | | | |
|---|---|---|---|
| 5,282,158 A * | 1/1994 | Lee ................................. | 365/96 |
| 6,693,009 B1 * | 2/2004 | Kim et al. .................... | 438/257 |
| 6,710,403 B2 | 3/2004 | Sapp | |
| 6,916,715 B2 * | 7/2005 | Hsiao et al. .................. | 438/275 |
| 7,227,219 B2 * | 6/2007 | Mikolajick ................... | 257/324 |
| 7,804,126 B2 * | 9/2010 | Eitan et al. ................... | 257/324 |
| 2001/0028075 A1 * | 10/2001 | Chen et al. .................... | 257/296 |
| 2004/0232471 A1 * | 11/2004 | Shukuri ........................ | 257/314 |
| 2005/0173750 A1 * | 8/2005 | Park ............................. | 257/304 |
| 2006/0084219 A1 * | 4/2006 | Lusky ................... | H01L 27/115 438/201 |
| 2007/0051982 A1 * | 3/2007 | Bloom ................ | H01L 21/0337 257/202 |
| 2007/0123017 A1 * | 5/2007 | Sadjadi et al. ............... | 438/597 |
| 2007/0158688 A1 * | 7/2007 | Caspary et al. .............. | 257/208 |
| 2008/0042191 A1 * | 2/2008 | Lin et al. ...................... | 257/324 |
| 2009/0173985 A1 * | 7/2009 | Lee et al. ...................... | 257/315 |
| 2010/0244117 A1 * | 9/2010 | Prall et al. .................... | 257/316 |

* cited by examiner

*Primary Examiner* — Thomas L Dickey
*Assistant Examiner* — Damon Hillman
(74) *Attorney, Agent, or Firm* — Eitan, Mehulal & Sadot (57) ABSTRACT

A nitride read only memory (NROM) array includes a silicon substrate having trenches therein, a plurality of polysilicon bit lines deposited in the trenches and connecting columns of memory cells, a layer of (oxide nitride oxide) ONO at least within the memory cells and a plurality of polysilicon word lines to connect rows of the memory cells. An NROM array with a virtual ground architecture includes a plurality of bit lines to connect columns of NROM memory cells, a layer of ONO at least within the memory cells and a plurality of word lines to connect rows of the NROM memory cells, wherein a distance between word lines is at least twice the width of the word lines.

7 Claims, 8 Drawing Sheets

MINIMIZING DISTURBS IN DENSE NON VOLATILE MEMORY ARRAYS

This application claims benefit from U.S. Provisional Patent Application No. 61/344,840, filed Oct. 21, 2010, which is hereby incorporated in its entirety by reference.

FIELD OF THE INVENTION

The present invention relates to non-volatile memory arrays generally and to the structure of a 32 nm cell in particular.

BACKGROUND OF THE INVENTION

There are many types of non-volatile memory cells, such as floating gate cells and NROM (nitride read only memory) or MirrorBit cells, all of which store charge in a storage layer of the cell which overlays an active channel of the cell.

Figure 1:
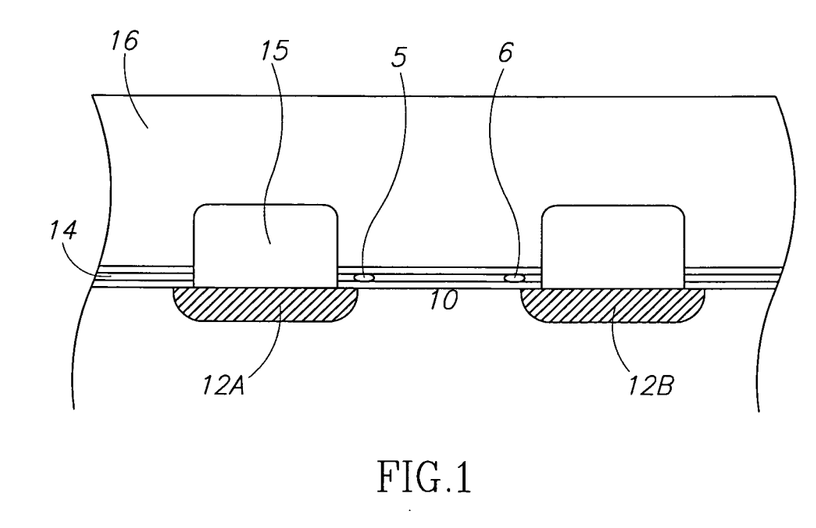
FIG. 1 is a schematic illustration of a prior art NROM memory cell.

An exemplary NROM cell is shown in FIG. 1, to which reference is now made. The active channel of the cell, labeled 10, lies between two junction bit lines 12. Above channel 10 is the storage layer, labeled 14, which, for NROM cells, is comprised of an oxide-nitride-oxide sandwich. Running perpendicularly to bit lines 12 is a word line 16, formed of polysilicon. In the NROM cell, the charge is stored in the nitride layer of ONO sandwich 14. An insulator 15 is placed on top of bit line 12 to avoid electrical shorts between bit lines and word lines.

Storage layer 14 affects the activity of the channel. If the layer is charged, no current can flow through channel 10 while if the storage layer is not charged, current can flow. By measuring the current through channel 10 of a particular cell, the data stored therein (defined by the presence or absence of charge) may be read.

The cell shown in FIG. 1 can store two physically separated packs of charges, labeled 5 and 6, thus enabling two digital bits per one cell. To program bit 6 for example, the channel hot electron (CHE) mechanism is invoked by applying 0V on bit line 12a, 3-6V on bit line 12b and 5-10V on word line 16. Electrons travelling in channel 10, from bit line 12a to bit line 12b, heat up (i.e. collect kinetic energy), particularly in the vicinity of bit line 12b. Some of the electrons are scattered, causing them to be injected into trapping layer 14 at the location of bit 6. To program bit 5, the voltages provided to bit lines 12a and 12b are exchanged.

SUMMARY OF THE PRESENT INVENTION

There is provided, in accordance with a preferred embodiment of the present invention, a nitride read only memory (NROM) array including a silicon substrate having trenches therein, a plurality of polysilicon bit lines deposited in the trenches and connecting columns of memory cells, a layer of ONO (oxide nitride oxide) at least within the memory cells and a plurality of polysilicon word lines to connect rows of the memory cells.

There is also provided, in accordance with a preferred embodiment of the present invention, a nitride read only memory (NROM) array including a plurality of at least partially insulated polysilicon bit lines connecting columns of memory cells, a layer of ONO (oxide nitride oxide) at least within the memory cells and a second plurality of polysilicon word lines to connect the rows of memory cells.

Moreover, in accordance with a preferred embodiment of the present invention, the polysilicon bit lines are formed of doped polysilicon. For example, the doped polysilicon is in-situ doped polysilicon.

Further, in accordance with a preferred embodiment of the present invention, and also including an oxide liner along at least a portion of the inside walls of the trench.

Still further, in accordance with a preferred embodiment of the present invention, each bit line includes deposited polysilicon within the trench, doped with Arsenic and a bit line junction diffused to the sides of the polysilicon formed from the Arsenic.

Moreover, in accordance with a preferred embodiment of the present invention, a depth of the trenches is at least ½ of a lithographic feature size F.

There is also provided, in accordance with a preferred embodiment of the present invention, an NROM array with a virtual ground architecture including a plurality of bit lines to connect columns of NROM memory cells, a layer of ONO (oxide nitride oxide) at least within the memory cells and a plurality of word lines to connect rows of the NROM memory cells, wherein a distance between word lines is at least twice the width of the word lines.

Further, in accordance with a preferred embodiment of the present invention, the distance is at least three times the width of the word lines.

Still further, in accordance with a preferred embodiment of the present invention, an even set of word lines is deposited separately from an odd set of word lines.

Moreover, in accordance with a preferred embodiment of the present invention, one of the even set and the odd set is self-aligned to the other.

There is also provided, in accordance with a preferred embodiment of the present invention, a method for manufacturing bit lines of an NROM array. The method includes cutting trenches in a silicon substrate for bit lines of the array, the bit lines to connect columns of memory cells of the array and depositing polysilicon into the trenches to form the bit lines.

Further, in accordance with a preferred embodiment of the present invention, the method also includes insulating the trenches before depositing the polysilicon.

Still further, in accordance with a preferred embodiment of the present invention, the insulating is performed by oxidation growth inside the trench.

Moreover, in accordance with a preferred embodiment of the present invention, the insulating is performed by deposition of oxide.

Additionally, in accordance with a preferred embodiment of the present invention, the method also includes doping the bit lines and annealing the bit lines to create bit line junctions.

There is also provided, in accordance with a preferred embodiment of the present invention, a method for manufacturing bit lines of an NVM array. The method includes depositing polysilicon into a silicon substrate to generate bit lines of the array.

Additionally, in accordance with a preferred embodiment of the present invention, the method also includes cutting trenches in the silicon substrate and insulating the trenches before depositing the polysilicon.

Further, in accordance with a preferred embodiment of the present invention, the insulating is performed by oxidation growth inside the trench.

Still further, in accordance with a preferred embodiment of the present invention, the insulating is performed by deposition of oxide.

Finally, in accordance with a preferred embodiment of the present invention, the method also includes doping the bit lines and annealing the bit lines to create bit line junctions.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that, since the CHE mechanism is a statistical scattering event, some electrons may reach adjacent cells residing nearby in the densely populated array.

Applicants have realized that such scatter reduces the efficiency of the programming but is of little consequence as long as the scatter remains within the operational space of the cell. However, as Applicants have realized, as the cells become smaller and smaller, the chances that the scattered electrons may affect neighboring cells, by accidentally programming them, become higher. These "disturbs" reduce the reliability of the cells.

Figure 2:
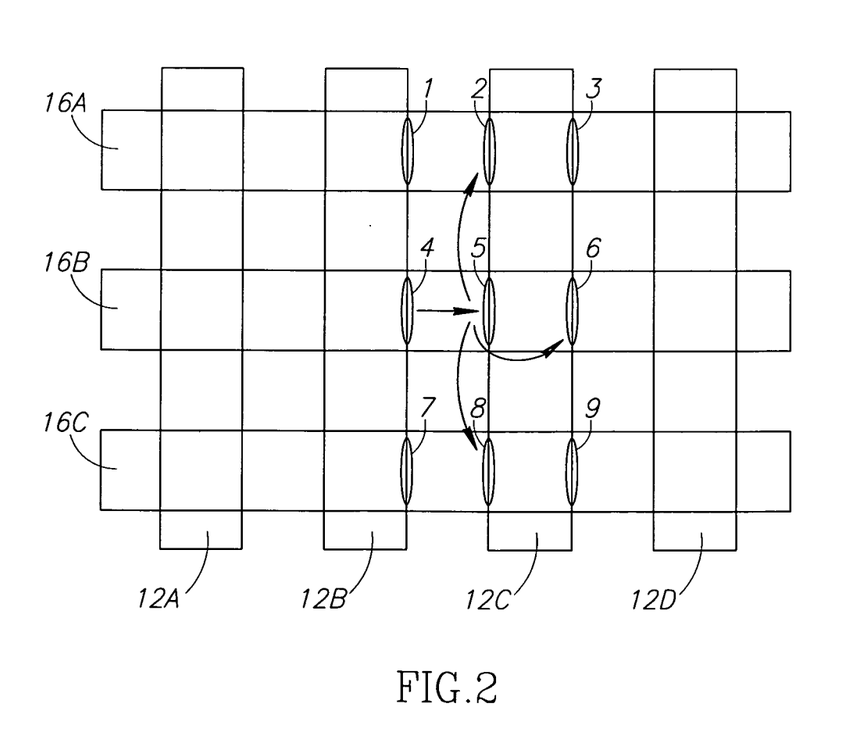
FIG. 2 is a schematic illustration of a virtual ground array of NROM memory cells.
Figure 3:
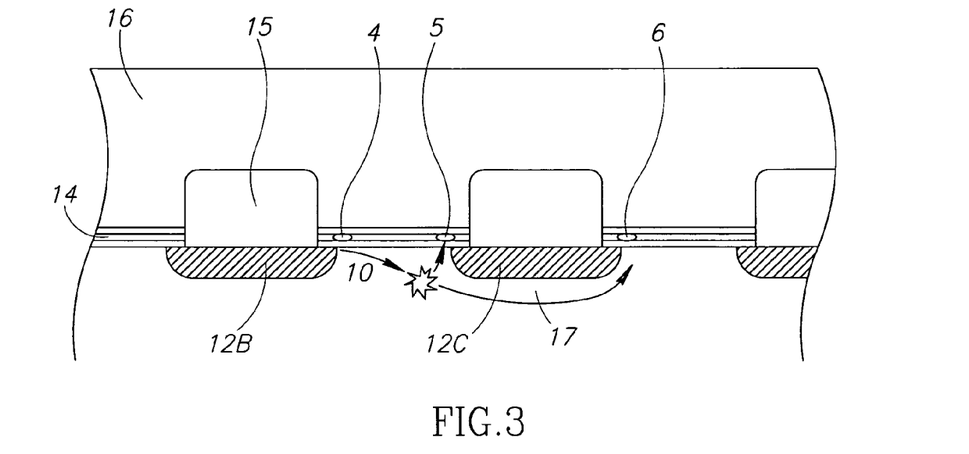
FIG. 3 is a schematic illustration of scattering of electrons in a prior art NROM cell.

FIGS. 2 and 3, to which reference is now made, illustrate the problems. FIG. 2 is a top view drawing of a portion of an array, showing a few bit lines 12 and a few word lines 16, while FIG. 3 is a side view of the NROM cell, similar to FIG. 1. Circles labeled 1-9 represent trapping sites inside layer 14 (FIG. 3) where the digital bits are represented.

As bit lines 12 and/or word lines 16 get closer to each other, the cells become smaller. When programming bit 5, for example, electrons start travelling in channel 10 (FIG. 3) from bit line 12b towards bit line 12c. In the close vicinity of bit 5, the hot electrons are scattered. Some reach the trapping layer 14 above and get trapped (bit 5). However, due to the statistical nature of the scattering, a few electrons may scatter in other directions. Some travel under bit line 12c (described in more detail with respect to FIG. 3) and may reach bit 6, or they may travel sideways and may reach bits 8 or 2. Such an unwanted injected charge may corrupt the status of bits 6, 8 or 2 and may thus degrade the reliability of the non volatile array.

FIG. 3 shows a mechanism where hot electrons travel in channel 10, reach a location near bit 5, are scattered and can either be injected up to trapping layer 14 to bit location 5 (the desired mechanism), or can travel under bit line 12C in a depletion region 17, to be injected into the trapping layer 14 of bit 6 (the undesired mechanism).

Applicants have realized that making deeper bit lines may help confine the scatter to the activated channel. The deeper the bit lines are, the harder it is for the scattered electrons to escape to a neighboring cell connected to the same word line. In an exemplary embodiment, the depth of the bit lines may be ½ a lithographic feature size F or deeper.

Moreover, Applicants have realized that making bit line trenches and depositing doped polysilicon into the bit line trenches may provide further improvements by not only confining the scattered electrons but by making the bit lines more conductive. More conductive bit lines may have a reduced bit line resistance which, in turn, may enable a memory array using such polysilicon bit lines to operate with lower bit line voltages which, in turn, may reduce the amount of scatter to begin with, and may also reduce leakage to adjacent cells along the bit lines. Furthermore, with this concept, the bit lines may be narrow, which produces a smaller array.

Figure 4:
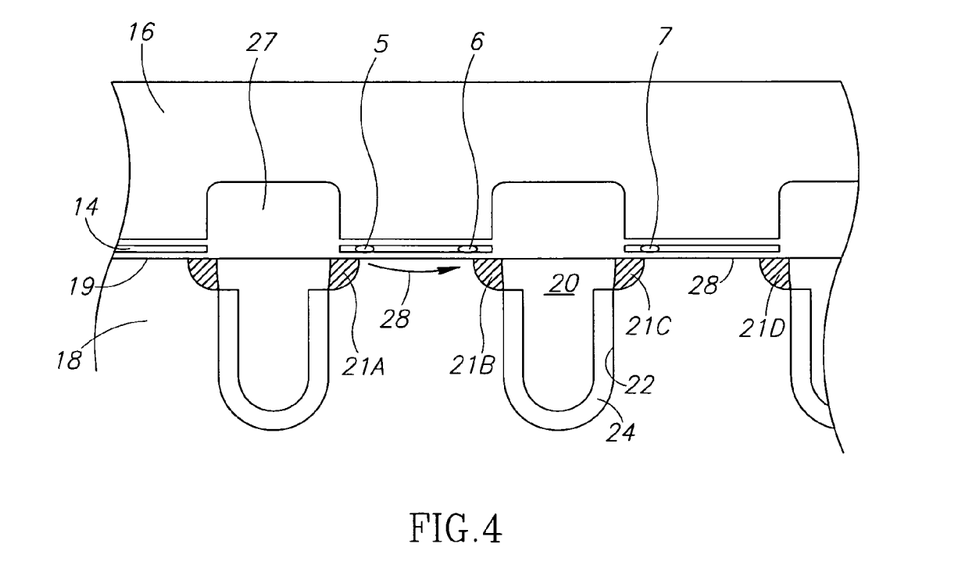
FIG. 4 is a schematic illustration of an NROM cell, constructed and operative in accordance with a preferred embodiment of the present invention.

Reference is now made to FIG. 4, which illustrates a cross-section of an NROM or MirrorBit memory array having deep polysilicon bit lines 20 formed within bit line trenches 22, cut into a silicon substrate 18. The polysilicon may be highly doped to obtain low bit line resistance. Bit line trenches 22 may have an insulating liner 24, such as of oxide, therein, which may cover most of the trench.

Bit line junctions 21 may be located at both sides of the bit line trench, close to a surface 19 of silicon 18, to enable relatively efficient injection operations into the trapping layer 14 above the channel 10 of both electrons during programming as well as holes during erasure. The bit line junctions 21 may be electrically shorted to the bit line polysilicon that resides in the trench, and thus, may, in general, be called bit lines. Bit line insulator 27 may be placed over bit lines 20 to isolate between bit line polysilicon 20 and word line conductor 16. Insulator 27 may be composed of silicon oxide.

To program bit 6, a low or zero voltage may be provided on bit line 21a, a high voltage (3-7V) on bit line 21b and a high voltage (5-10V) on word line 16. Under these conditions, electrons may travel from bit line 21a to bit line 21b in an inversion layer (not shown) along silicon surface 19. The electrons may gain kinetic energy and then, close to bit line 21b, some of the electrons may cause scattering. Those pointing up after scattering may be trapped in layer 14 into bit 6. While in the structure described in FIG. 3 some electrons reached a bit in another cell causing damage, in the cell of FIG. 4, deep bit line 20 may prevent hot electrons from traveling under bit line and from reaching bit 7, thus reducing unwanted disturbs.

Bit lines 20 may be formed of doped polysilicon (which may be doped in-situ or the doping may be implanted) which may make them more conductive than bit lines 12 of the prior art. The resultant low bit line resistance may enable a smaller range of operating voltages than in the prior art and thus, fewer arrays disturbs. For example, The prior art required a range of 3-4V for programming, where the lower voltages are used for the memory cells close to a contact and the higher voltages are used to overcome the resistance of the bit line, which creates a voltage drop, for cells further along the bit line and thus, farther from the contact. In the memory array of the present invention, due to the low bit line resistance, the range required may be 3-3.5V.

Moreover, since trenches 22 may be narrow and deep, the low resistance bit lines may consume less area, enabling better scaling of the array.

It is known in the art that deepening bit line junctions may worsen punch through current, which is an enhanced, unwanted leakage current between adjacent bit lines due to a partial merger of depletion regions of junctions 21 which happens under applied reverse voltage.

However, in accordance with a preferred embodiment of the present invention, bit line trenches 22 may be lined with insulator 24 which may insulate bit lines 20 from substrate 18 and may act to minimize the punch through phenomenon. When applying a reverse bias voltage on bit lines 20, a significant portion of the voltage drops across insulator 24, rather than on the depletion layer in the substrate of the cell of FIG. 1, thereby reducing the width of the depletion layer and thus minimizing the punch through leakage.

Figure 5A:
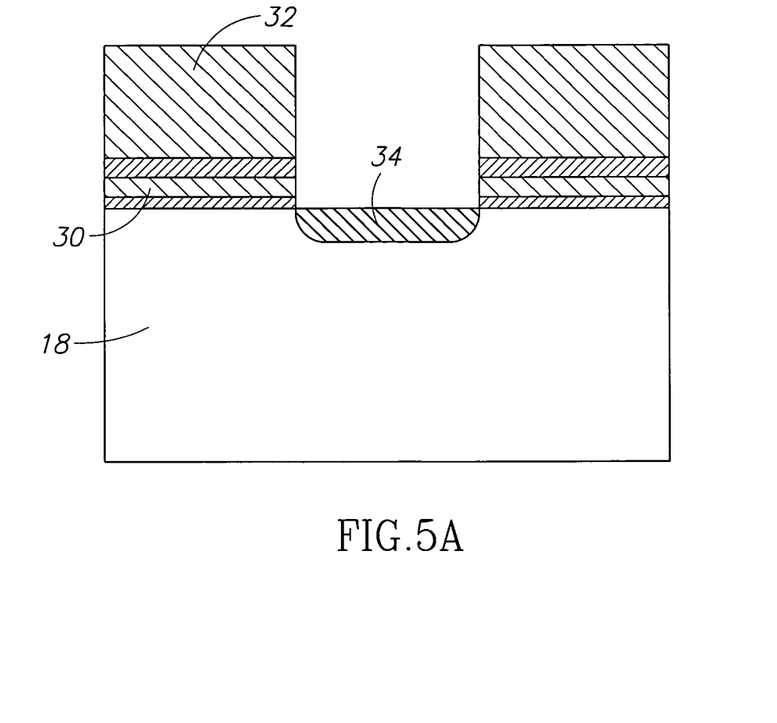
FIGS. 5A-5H are schematic illustrations of the main steps in creating the NROM cell of FIG. 4.

Reference is now made to FIGS. 5A-5H, which illustrate the process flow to manufacture bit lines 20. As shown in FIG. 5A, initially, oxide, nitride and oxide layers, shown as an ONO layer 30, may be laid down on substrate 18 and then covered with a nitride hard mask 32. A hard mask etch may cut through nitride hard mask 32, according to a bit line lithography. For example, the bit line lithograph may define bit lines of a specific width. An ONO etch may then cut through ONO layer 30 in the openings defined by the hard mask etch.

Optionally, a shallow Arsenic implant 34, such as of 4 KeV, may be implanted at this point. If so, a spike anneal operation may occur to anneal and defuse the implant within substrate 18, to generate bit line junctions 21. The anneal operation may also be performed without implant 34, in which case, bit line junctions 21 may be formed later on from the diffusion of the dopant within bit lines 20 into substrate 18 (as shown in FIG. 5E, hereinbelow).

Figure 5B:
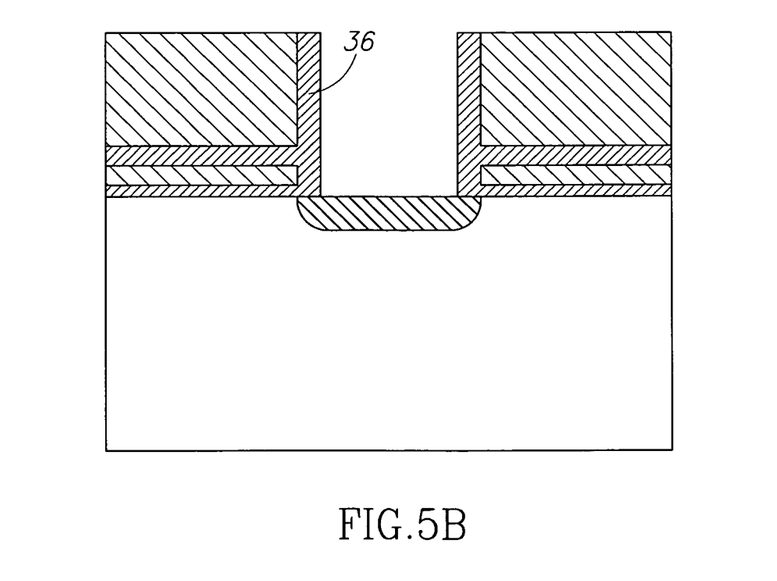

As shown in FIG. 5B, an oxide spacer 36 may now be deposited on the walls of nitride hard mask 32 and ONO layer 30.

Figure 5C:
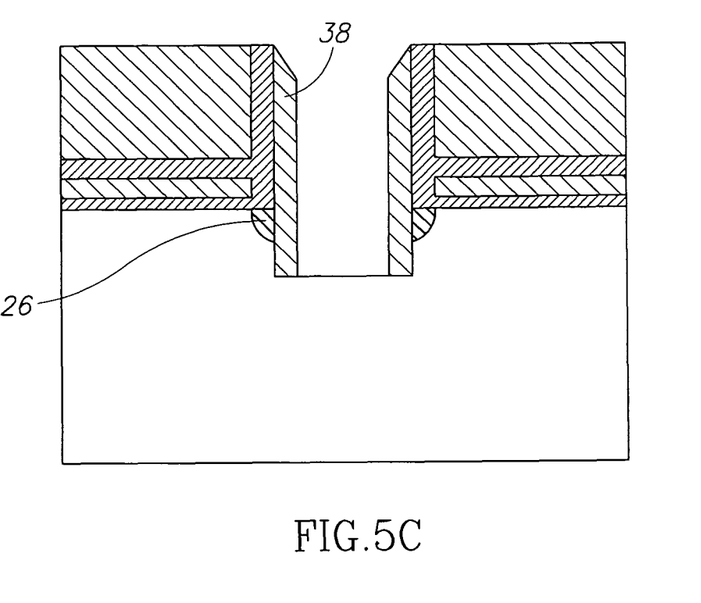

With nitride hard mask 32, ONO layer 30 and oxide spacer 36 as masks, a reactive ion etching (RIE) may be performed, to etch silicon substrate 18 between oxide spacers 36, as shown in FIG. 5C. This etch process may etch a relatively short distance into silicon substrate 18, such as 10 nm. It will be appreciated that this etch process may etch a large portion of Arsenic implant 34, leaving only a portion 26 under oxide spacer 34. A nitride spacer 38 may then be added, such as of 4 nm wide.

Figure 5D:
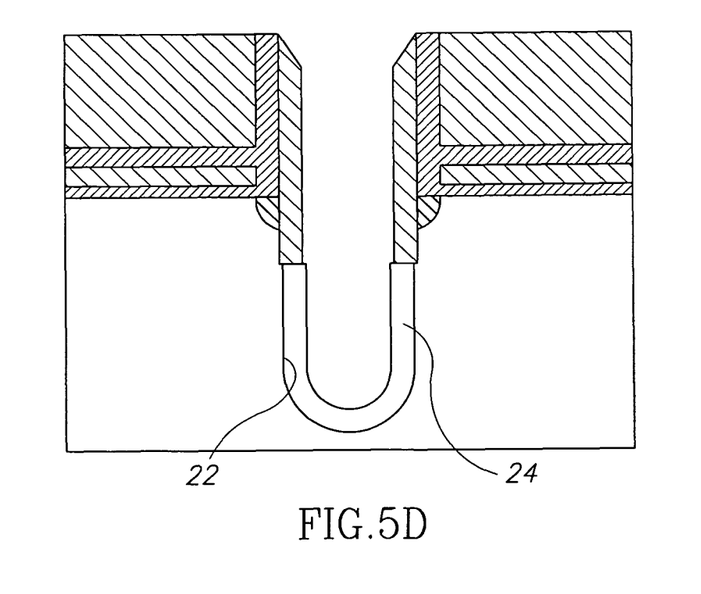
Figure 5E:
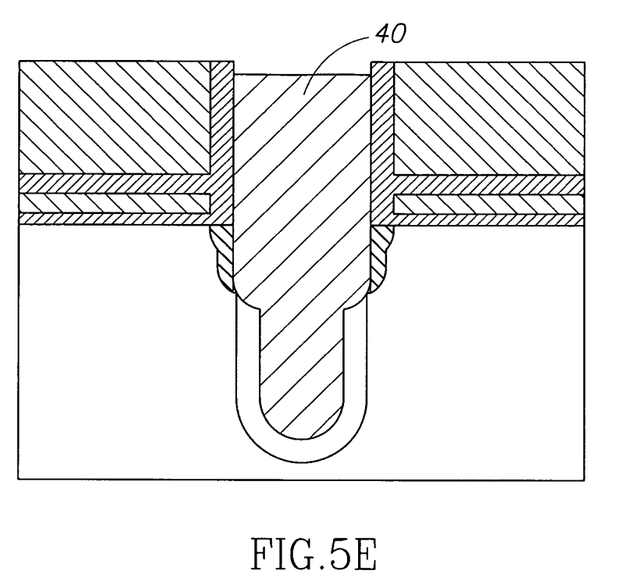

A second RIE etch, for example of 50 nm, may now be performed, to deepen bit line trenches 22, to at least ½ F. Bit line trenches 22 may now be of about 60 nm deep. A low temperature oxidation, for example of 7 nm, may be performed to add insulating liner 24, as shown in FIG. 5D. Oxide deposition is also possible and is considered part of the present invention.

As shown in FIG. 5E, a nitride etch back may be performed to remove nitride spacer 38, leaving lined bit line trenches 22 and the space between ONO layers 30 which may then be filled with in-situ doped polysilicon 40, typically doped with Arsenic. Some of the Arsenic may diffuse out in later anneal processes, into the silicon. Polysilicon 40 may be polished with a CMP process to ensure that its surface is not above the upper surface of nitride hard mask 32.

Figure 5F:
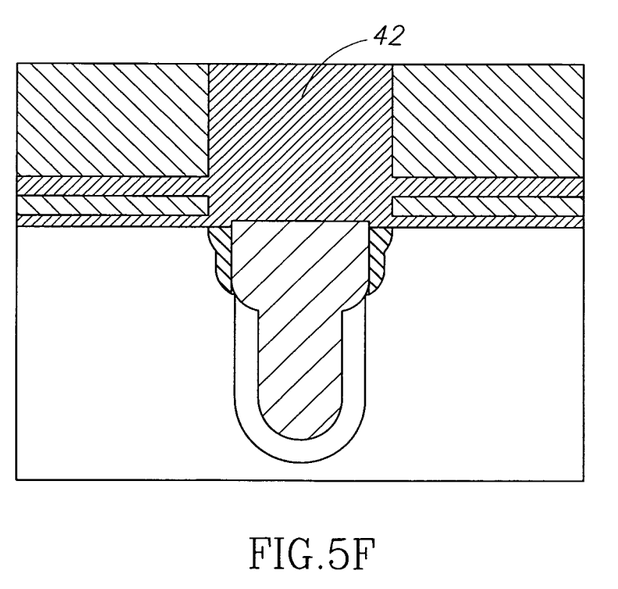

To keep the bit lines within substrate 18 and not touching ONO layer 30, a polysilicon etch back process may be performed, such as of about 44 nm. The space between ONO layers 30 may then be filled with bit line oxides 42, as shown in FIG. 5F. The wafer may then be polished in a CMP process.

Figure 5G:
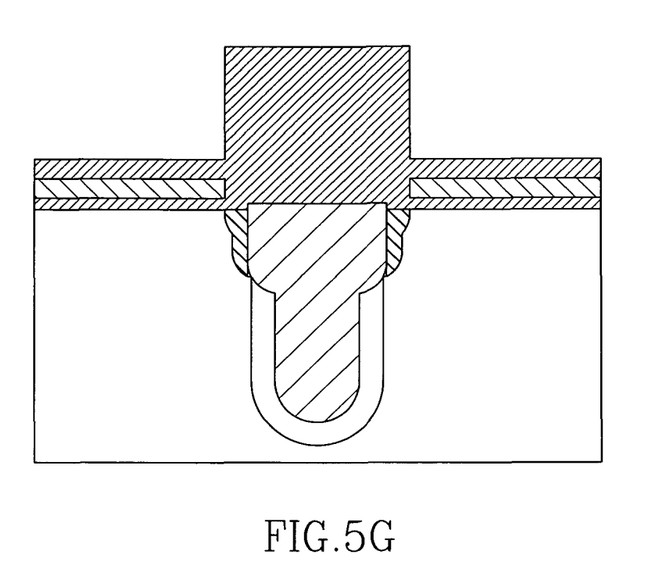
Figure 5H:
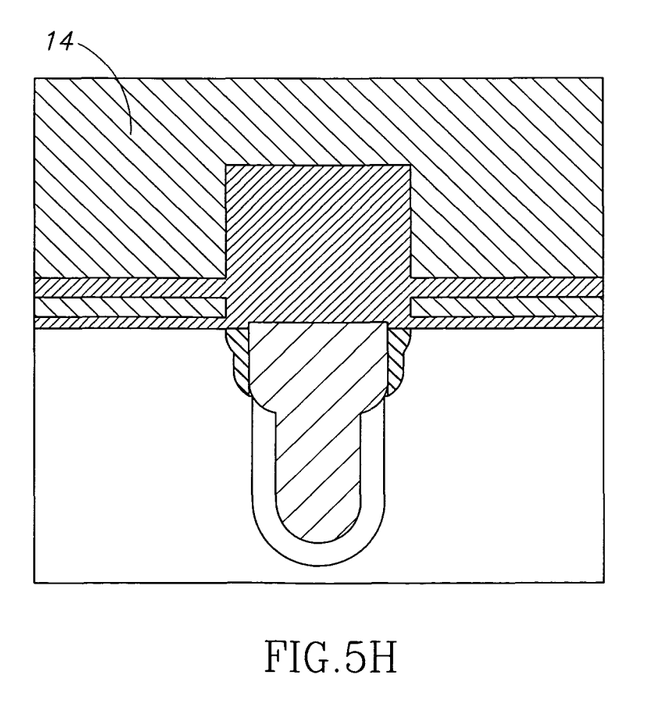

Nitride hard mask 32 may be removed, as shown in FIG. 5G, with a nitride wet etch and, as shown in FIG. 5H, word lines 14 may be laid down on top, in a second polysilicon deposit operation. The wafer may be finished in accordance with standard processing operations.

Applicants have realized that another source of disturbs is the fact that, as memory array technologies are reduced, the spacing between word lines 14 is reduced and the hot electron mechanism created in one memory cell for programming a bit might cause scatter of electrons to a memory cell located in an adjacent word line.

Applicants have also realized that increasing the distance between word lines 14 may reduce disturbs. This reduction should generally be at the expense of the width of word lines, so as not to increase cell size. Such thin word lines may be generated in many different ways. For example, as Applicants have realized, the method described in U.S. Pat. No. 7,804,126, which may generate double density word lines with tight spacing between word lines, may be modified to provide relatively thin word lines with wide spacing between word lines. For example, a minimum ratio of 1:2 between word line and spacing may be required and a ratio of 1:3 may be desired.

Figure 6A:
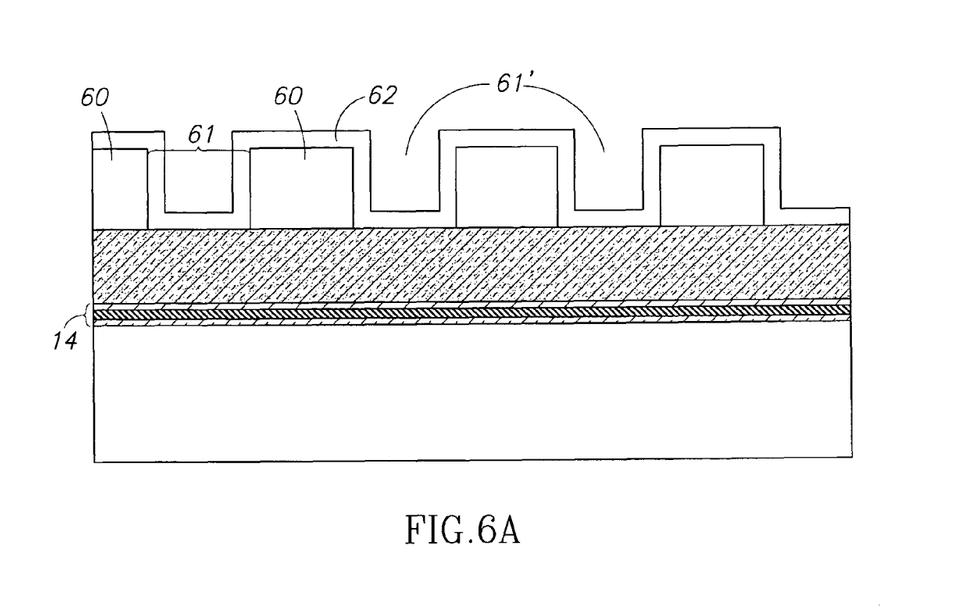
FIGS. 6A-6D are schematic illustrations of the main steps in creating word lines of NROM cells in an alternative embodiment of the present invention.
Figure 6B:
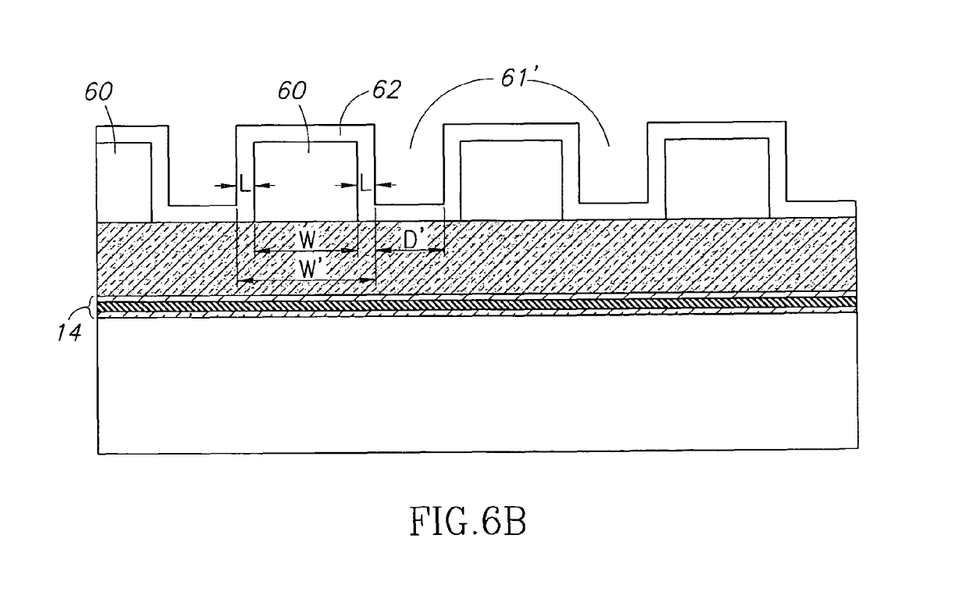

Reference is now made to FIGS. 6A-6D, which illustrate a method for generating double density word lines. In this method, mask rows 60, such as a nitride hard mask, are initially laid down at the feature size F. Thus, mask rows 60 have a width W of size F and a distance therebetween of size F. To reduce the distance between elements, an extended mask structure may be generated by extending mask width W of rows 60. For example, a liner 62, of width L, may first be deposited over rows 60 and may then be etched back to generate spacers 62' (as shown in FIG. 6B). If the first mask is of nitride, then liner 62 (and the subsequent spacers 62') may also be of nitride. The spacer etch may be such to make spacers 62' with vertical sides and a planarization step may be performed later to make them flat. FIG. 6B shows them steep and rectangular.

Spacers 62' reduce the size of opening 61, now labeled 61', by twice the width L of liner 62. Thus, reduced opening 61' may be of a sub-F width D'=D−2 L. Similarly, spacers 62' may increase the mask width W of rows 60 to W'=W+2 L.

In accordance with a preferred embodiment of the present invention, liner 62 (and subsequent spacers 62') may be made quite thick with respect to the width of opening 61, in order to generate narrow word lines in reduced opening 61'.

For a mask width of 32 nm and opening width of 32 nm, liner 62 may be of width L=11 nm, which generates sub-F opening 61' of spacing D'=10 nm and extended mask width W' of 54 nm. Polysilicon 64 (seen in FIG. 6C) may be deposited in openings 61' to create the even rows and mask rows 60 and spacers 62' may be removed, such as with a nitride wet etch.

Figure 6C:
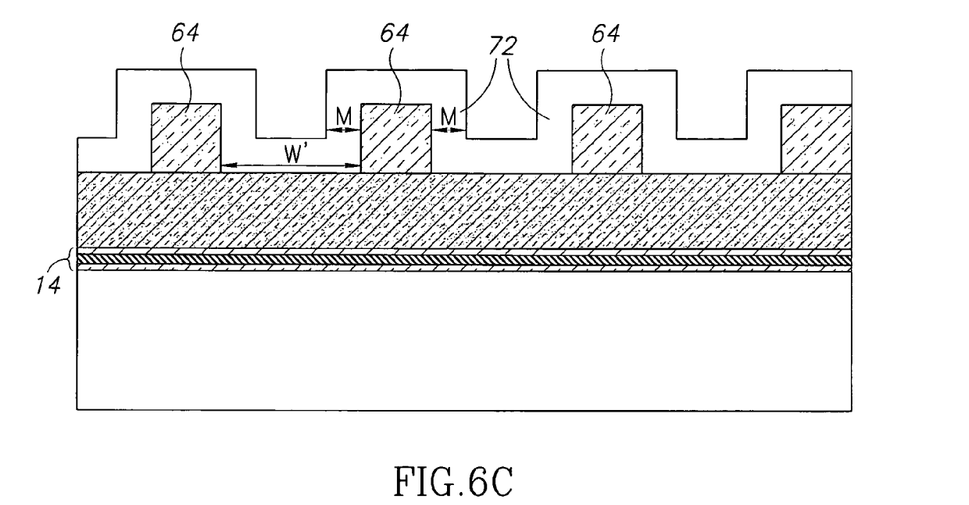

The openings for the odd rows may be generated by creating another extended structure, this time from the existing even polysilicon rows 64. As shown in FIG. 6C, another liner, labeled 72, may be deposited on the array and may be etched back to a spacer 72' (shown in FIG. 6D). Spacer 72' may be of nitride, as before, or of another material. For this mask, the spacer may be of sufficient width M to reduce extended opening 70 from extended width W' to a sub-F opening 70' whose width W" may be generally equivalent to D', the width of even polysilicon rows 60. Typically, W"=W'−2M. Moreover, second spacer width M may typically be at least twice first spacer width L. For the present example, width M of liner 72 may be 22 nm. If a vertical wall spacer is desired, it may be generated through multiple deposition and etch processes. A second polysilicon deposition may be performed to deposit polysilicon into openings 70' to create the odd rows.

Figure 6D:
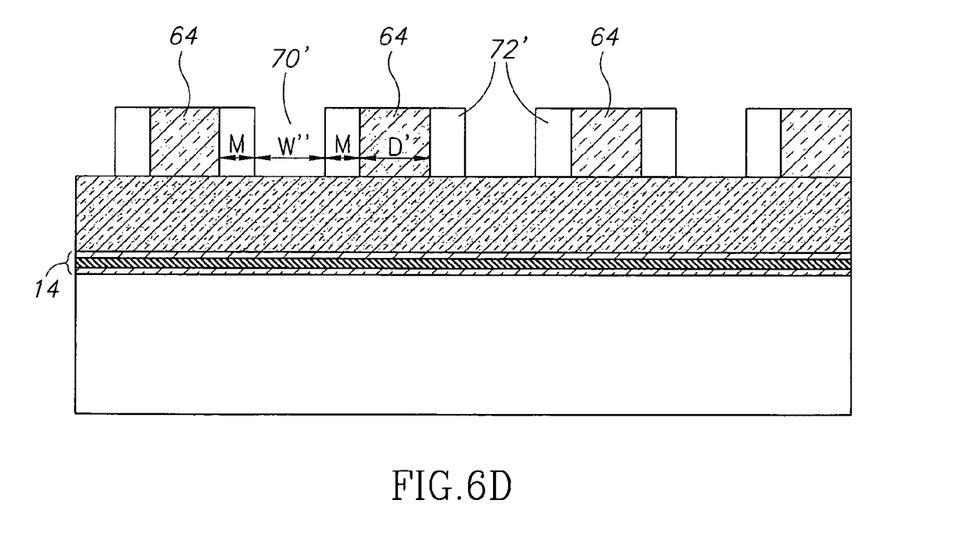

In the previous embodiment, the ratio between polysilicon rows, of width 10 nm, and the distance between them, of width 22 nm, is about 1:2. To create a 1:3 ratio in a 32 nm technology, the polysilicon word lines should be about 8 nm and thus, first spacers 62' should be 12 nm wide and second spacers 72' should be 24 nm wide. Other ratios may be generated and are incorporated within the present invention.

It will be appreciated that second spacers 72' define the width between word lines. Thus, in accordance with a preferred embodiment of the present invention, second spacers 72' should be as large as possible.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A nitride read only memory (NROM) array comprising:
    a silicon substrate having trenches therein;
    oxide liners along at least a portion of the inside walls of said trenches;
    a plurality of polysilicon bit lines deposited on top of said oxide liners and filling said trenches, said bit lines connecting columns of memory cells;
    a charge trapping layer of ONO (oxide nitride oxide) at least on top of horizontal channels in said substrate between said bit lines at least in said memory cells; and
    a plurality of polysilicon word lines to connect rows of said memory cells,
    wherein said oxide liner insulates said bit lines from said silicon substrate.

2. The array according to claim 1 and wherein said polysilicon bit lines are formed of doped polysilicon.

3. The array according to claim 2 and wherein said doped polysilicon is in-situ doped polysilicon.

4. The array according to claim 1 and also comprising at least at the sides of said polysilicon bit lines above said oxide liners.

5. The array according to claim 1 and wherein a depth of said trenches is at least ½ of a lithographic feature size F.

6. A method for manufacturing bit lines of an NROM array, the method comprising:
    cutting trenches in a silicon substrate for bit lines of said array, said bit lines to connect columns of memory cells of said array;
    insulating said trenches by depositing an oxide lining on the walls of said trenches; and
    depositing polysilicon on said oxide lining to form said bit lines;
    creating a charge trapping layer of ONO (oxide nitride oxide) at least on top of horizontal channels in said substrate between said bit lines at least in said memory cells.

7. The method according to claim 6 and also comprising doping said bit lines and annealing said bit lines to create bit line junctions.

* * * * *